(12) United States Patent
Broekaart et al.

(10) Patent No.: US 9,583,531 B2
(45) Date of Patent: Feb. 28, 2017

(54) PROCESS FOR TRANSFERRING CIRCUIT LAYER

(71) Applicant: Soitec, Crolles (FR)

(72) Inventors: Marcel Broekaart, Theys (FR); Laurent Marinier, Lumbin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/899,243

(22) PCT Filed: Jun. 16, 2014

(86) PCT No.: PCT/FR2014/051478
§ 371 (c)(1),
(2) Date: Dec. 17, 2015

(87) PCT Pub. No.: WO2014/202886
PCT Pub. Date: Dec. 24, 2014

(65) Prior Publication Data
US 2016/0148971 A1    May 26, 2016

(30) Foreign Application Priority Data

Jun. 19, 2013  (FR) ..................... 13 55765

(51) Int. Cl.
*H01L 21/00* (2006.01)
*H01L 27/146* (2006.01)
(Continued)

(52) U.S. Cl.
CPC .... *H01L 27/14687* (2013.01); *H01L 21/6835* (2013.01); *H01L 21/78* (2013.01);
(Continued)

(58) Field of Classification Search
CPC . H01L 2224/32225; H01L 2224/32145; H01L 21/6835; H01L 21/78
See application file for complete search history.

(56) References Cited

U.S. PATENT DOCUMENTS 5,071,792 A     12/1991  VanVonno et al.
5,897,333 A *   4/1999   Goossen ............... H01L 21/561
                                                148/DIG. 135
(Continued)

FOREIGN PATENT DOCUMENTS

EP     1962325 A1     8/2008
WO     2011082857 A2  7/2011

OTHER PUBLICATIONS

French Search Report for French Application No. FR1355765 dated Mar. 4, 2014, 2 pages.

(Continued)

*Primary Examiner* — Zandra Smith
*Assistant Examiner* — John M Parker
(74) *Attorney, Agent, or Firm* — TraskBritt

(57) ABSTRACT

A process for transferring a buried circuit layer comprises taking a donor substrate comprising an internal etch stop zone and covered on its front side with a circuit layer, producing over the entire circumference of the donor substrate either a peripheral trench or a peripheral routing, the routing or trench being produced over a depth such that they pass entirely through the circuit layer and extend into the donor substrate, depositing on the circuit layer and on the routed side or on the walls of the trench a layer of an etch stop material that is selective with respect to etching of the circuit layer, without filling the trench, bonding a receiver substrate to the donor substrate, and thinning the donor substrate by etching its back side until reaching the etch stop zone so as to obtain the transfer of the buried circuit layer to the receiver substrate.

19 Claims, 4 Drawing Sheets

(51) Int. Cl.
    *H01L 21/78*    (2006.01)
    *H01L 25/00*    (2006.01)
    *H01L 21/683*   (2006.01)

(52) U.S. Cl.
    CPC .......... *H01L 25/50* (2013.01); *H01L 27/1464* (2013.01); *H01L 27/14636* (2013.01); *H01L 2221/68363* (2013.01); *H01L 2924/0002* (2013.01)

(56)  References Cited

U.S. PATENT DOCUMENTS

| | | | | |
|---|---|---|---|---|
| 2003/0181001 A1* | 9/2003 | Aga | .................. | H01L 21/76254 438/200 |
| 2005/0074954 A1* | 4/2005 | Yamanaka | ........ | H01L 27/14618 438/458 |
| 2005/0266657 A1* | 12/2005 | Moriwaki | ......... | H01L 21/31111 438/455 |
| 2007/0020873 A1 | 1/2007 | Yeh et al. | | |
| 2007/0148912 A1* | 6/2007 | Morita | ................ | H01L 21/2007 438/455 |
| 2009/0203167 A1* | 8/2009 | Mitani | ............. | H01L 21/76254 438/106 |
| 2011/0097874 A1* | 4/2011 | Broekaart | ............ | H01L 21/304 438/459 |
| 2011/0117691 A1* | 5/2011 | Broekaart | ............ | H01L 21/302 438/73 |
| 2011/0189834 A1* | 8/2011 | Castex | ............. | H01L 21/76256 438/455 |

OTHER PUBLICATIONS

International Search Report for International Application No. PCT/FR2014/051478 dated Oct. 20, 2014, 2 pages.

* cited by examiner

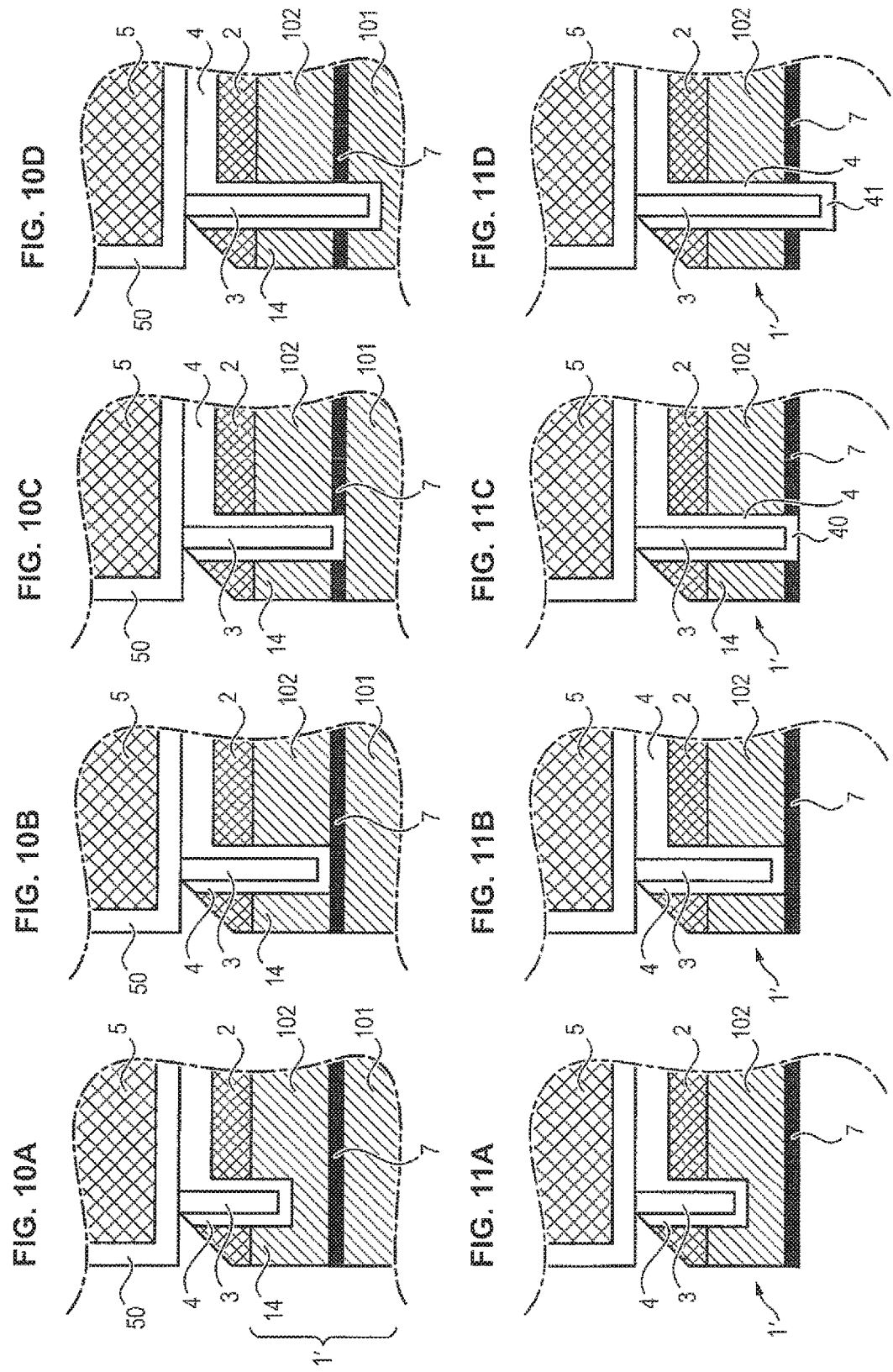

PROCESS FOR TRANSFERRING CIRCUIT LAYER

CROSS-REFERENCE TO RELATED APPLICATIONS

This application is a national phase entry under 35 U.S.C. §371 of International Patent Application PCT/FR2014/051478, filed Jun. 16, 2014, designating the United States of America and published as International Patent Publication WO 2014/202886 A1 on Dec. 24, 2014, which claims the benefit under Article 8 of the Patent Cooperation Treaty and under 35 U.S.C. §119(e) to French Patent Application Serial No. 1355765, filed Jun. 19, 2013, the disclosure of each of which is hereby incorporated herein in its entirety by this reference.

TECHNICAL FIELD

The disclosure lies in the field of electronics, optics and/or optoelectronics. This disclosure relates more specifically to a process for transferring a buried circuit layer.

Various electronic components are manufactured from a substrate that includes such a buried circuit layer. Among these, mention may be made, by way of example, of the sensors using backside illumination technology (known to a person skilled in the art under the acronym of "BSI sensor" for "backside illumination sensor"). They are based on a novel arrangement of the various layers forming them. These sensors make it possible to increase the amount of light captured and are, therefore, more efficient. They are intended to be used, in particular, in the screens of the latest generation tablets and telephones.

BACKGROUND

The thinning of a substrate used in the aforementioned technical fields may be carried out, for example, by chemical etching.

When a substrate of semiconductor-on-insulator (SeOI) type is thinned, the chemical etching is relatively easy to use since the buried oxide layer serves as an etch stop layer. When it is a question of a solid substrate, the thinning is slightly more complex since it is then necessary to create an etch stop layer, for example, by p- or n-type doping of the solid substrate.

However, in the particular case where the donor substrate comprises a buried circuit layer, the chemical etching of the layer of material that covers the buried circuit layer becomes truly problematic. Specifically, the chemical solutions used (for example, sulfuric acid ($H_2SO_4$), phosphoric acid ($H_3PO_4$) or hydrofluoric acid (HF) in the case of the etching of silicon) are particularly aggressive with respect to metals and, therefore, with respect to the layer comprising the circuits.

This results in a lateral etching of the buried circuit layer, which may reach a centimeter or more from the edge. The BSI sensors manufactured in the vicinity of this damaged zone are then unusable.

A process is already known from European Pat. No. EP 1 962 325 (hereinafter the '325 patent) for manufacturing a bonded substrate, by transfer of layers, which comprises steps of producing a peripheral groove on the front side of a donor substrate, of thermal oxidation of this substrate, of bonding a receiver substrate to the front side and of thinning the donor substrate from its back side, until the bottom of the groove is reached.

Such a process makes it possible to transfer to the receiver substrate only the central portion of the donor substrate and to remove the poorly bonded peripheral portion thereof.

However, the '325 patent absolutely does not describe the treatment of donor substrates comprising a buried circuit layer and, furthermore, such a layer would not withstand the thermal oxidation carried out, or the thermal treatment after bonding at more than 1000° C., which are described in the '325 patent.

The objective of the disclosure is, therefore, to propose a process for transferring a buried circuit layer that resolves the aforementioned drawbacks of the prior art and, in particular, that avoids damaging these circuits.

For this purpose, the disclosure relates to a process for transferring a buried circuit layer (2).

In accordance with the disclosure, this process comprises the following steps:

taking a donor substrate internally comprising an etch stop zone and covered on one of its sides, referred to as the "front" side, with a circuit layer, producing over the entire circumference of the donor substrate, on its side covered with the circuit layer, either a peripheral trench that extends at a distance from the lateral edge of the donor substrate, or a peripheral routing, the routing or trench being produced over a depth such that they pass entirely through the circuit layer and extend into the donor substrate, depositing on the exposed side of the circuit layer and on the routed side or on the walls of the trench, a layer of a stop material that is selective with respect to the etching of the circuit layer, referred to as a "second stop layer," without filling the trench, bonding a receiver substrate to the donor substrate on the side covered by the second stop layer, thinning the donor substrate (1) by chemical etching of its back side, until the etch stop zone is reached, so as to obtain the transfer of the buried circuit layer to the receiver substrate.

According to other advantageous and nonlimiting features of the disclosure, taken alone or in combination:

the etch stop zone is a layer, referred to as a "first stop layer," of a material that is selective with respect to the etching of the material of the back portion of the donor substrate;

the etch stop zone is an interface between a doped front layer and a non-doped back layer of the donor substrate;

the peripheral routing or the peripheral trench has a depth such that it passes through the etch stop zone, without penetrating into the back portion or the back layer of the donor substrate;

the peripheral routing or the peripheral trench is produced over a depth such that it does not pass through the etch stop zone and in that, after the chemical etching thinning step, an additional step of mechanical removal of the residual peripheral ring of the donor substrate is carried out, in particular, by grinding or chemical mechanical polishing (CMP);

the peripheral routing or the peripheral trench has a depth such that it passes through the etch stop zone and extends into the back portion or the back layer of the donor substrate and, after the chemical etching thinning step, an additional step of mechanical removal of the residue of the second stop layer is carried out, in particular, by grinding or chemical mechanical polishing (CMP);

the second stop layer is deposited by a technique selected from chemical vapor deposition (CVD) or spin coating;

the peripheral trench is produced with the aid of a technique selected from laser etching, dry etching and wet etching;

the peripheral trench is located at a distance from the lateral edge of the donor substrate of less than or equal to 5 mm;

the width of the trench is between 10 µm and 500 µm;

the materials forming the first and the second stop layer are selected from oxides or nitrides;

the materials forming the first and the second stop layer are selected from silicon oxide, silicon oxynitride or silicon oxycarbide;

the materials forming the first and the second stop layer are identical;

the donor substrate is produced from a semiconductor material;

the bonding of the donor and receiver substrates takes place by molecular adhesion.

BRIEF DESCRIPTION OF THE DRAWINGS

Other features and advantages of the disclosure will appear from the description that will now be given, with reference to the accoumpanying drawings, which represent, by way of indication but nonlimitingly, possible embodiments thereof.

In these drawings:

FIGS. 10A to 10D and 11A to 11D are detailed views on an enlarged scale of embodiment variants of certain steps of the process illustrated in FIGS. 4 and 5.

DETAILED DESCRIPTION

A first embodiment of the disclosure will now be described with reference to FIGS. 1 to 6.

Figure 1:
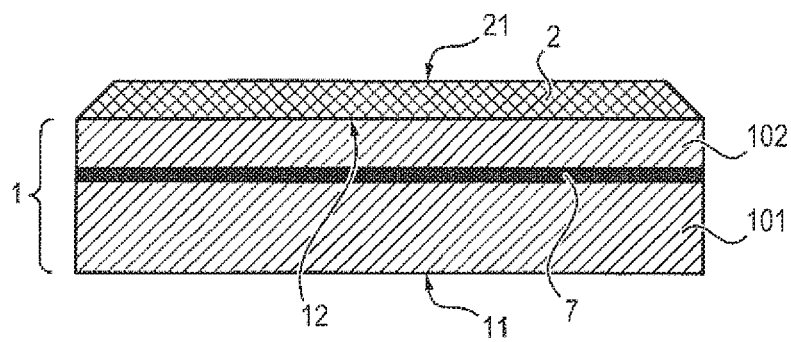
FIGS. 1 to 6 are diagrams representing the various steps of one embodiment of the process in accordance with the disclosure.

In FIG. 1, a donor substrate 1 can be seen that has a side 11, referred to as the "back side" and an opposite side 12, referred to as the "front side."

The front side 12 is covered with a circuit layer 2.

Moreover, this donor substrate 1 has an internal etch stop zone.

According to a first embodiment of the disclosure, this etch stop zone is a layer 7 of material referred to as a "first stop layer."

The first stop layer 7 thus divides the donor substrate 1 between a portion 102, referred to as a "front" portion, which extends between this first stop layer 7 and the circuit layer 2 and a portion 101, referred to as a "back" portion, which extends between this first stop layer 7 and the back side 11.

In the example represented, these front 102 and back 101 portions are monolayers. However, front portion 102 and back portion 101 could also be multilayers.

The first stop layer 7 is produced from a material that is selective with respect to the material(s) forming the donor substrate 1 and, in particular, to its back portion 101.

This first stop layer 7 may be obtained by deposition, for example, by chemical vapor deposition (CVD), or by epitaxy on the back portion 101. It may also be obtained by layer transfer.

The front portion 102 may be obtained after the formation of the first stop layer 7 by the same techniques as those mentioned above for the first stop layer 7.

According to another embodiment variant, the first stop layer 7 may also be implanted in the donor substrate 1 by doping. This technique makes it possible to avoid the step of adding the front portion 102 mentioned above.

By way of purely illustrative example, the donor substrate 1 may be of "semiconductor-on-insulator" (SeOI) or "silicon-on-insulator" (SOI) type. In this case, the first stop layer 7 consists of silicon oxide ($SiO_2$).

Figure 7:
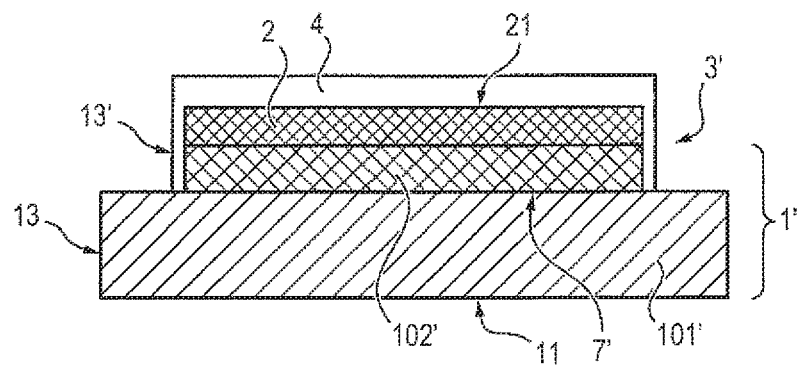
FIGS. 7 to 9 are diagrams representing some of the steps of another embodiment of the process in accordance with the disclosure.

According to a second embodiment of the disclosure, the etch stop zone may be simply an interface between two layers of the donor substrate. This embodiment variant is represented in FIG. 7. The interface bears the reference 7' and extends between a back layer 101' and a front layer 102' of the donor substrate 1'.

Preferably, the front layer 102' is a layer of the same chemical nature as the layer 101', but highly doped.

It will be noted that irrespective of the embodiment of the etch stop zone 7, 7', this is always produced before the formation of the circuit layer 2.

Figure 2:
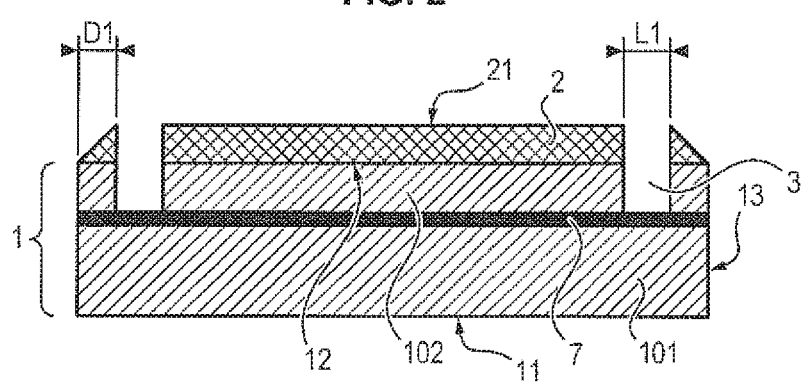

The next step of the process is represented in FIG. 2 and comprises producing over the entire circumference of the donor substrate 1, on its side covered with the circuit layer 2, a peripheral trench 3 that extends at a distance from a lateral edge 13 of the donor substrate 1.

The trench 3 is produced over a depth such that it passes entirely through the circuit layer 2 and such that it extends into the donor substrate 1 to a depth that will be described in detail subsequently in connection with FIGS. 10A-10D and 11A-11D.

Preferably, the peripheral trench 3 is produced with the aid of a technique selected from laser etching, dry etching and wet etching. With the first two techniques, it is not necessary to protect the circuit layer 2; on the other hand, with wet etching, it is necessary to add an etching mask on top of the circuit layer 2 in order to etch only the desired portion.

By way of example, the trench 3 advantageously has a width L1 of between 10 µm and 500 µm. Furthermore, the peripheral trench 3 is preferably located at a distance D1 from the lateral edge 13 of the donor substrate 1 of less than or equal to 5 mm. Such a distance makes it possible to maximize the retained central portion of the circuit layer 2, since it is this that will be subsequently used for the fabrication of electronic components.

The exposed side 21 of the circuit layer 2, that is to say its front side, and also the side and bottom internal walls of the trench 3, are then covered with a layer 4 of an etch stop material, which is selective with respect to the etching of the circuit layer 2 and is referred to as a "second stop layer."

This step takes place by deposition, preferably by a technique selected from chemical vapor deposition (CVD) or spin coating. Spin coating consists in depositing a viscous material over the central portion of the substrate and in spinning the substrate about a central axis.

Figure 3:
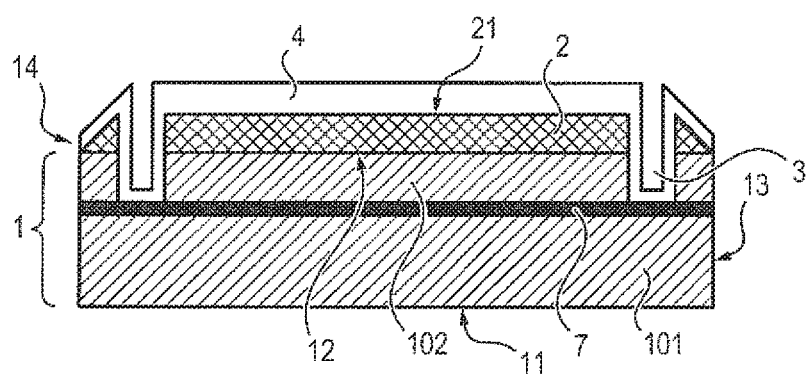

The step of forming the second stop layer 4, illustrated in FIG. 3, is carried out while taking care, of course, not to fill the trench 3 previously formed. The viscosity of the material used to form the etch stop layer 4 and the speed of rotation are selected so as not to fill the trench 3.

The materials forming the first stop layer 7 and the second stop layer 4 are preferably selected from oxides or nitrides, more preferably selected from silicon oxide ($SiO_2$), silicon oxynitride ($SiO_xN_y$), silicon oxycarbide ($SiO_xC_y$) or silicon nitride ($Si_3N_4$).

Silicon oxide may, for example, be deposited using tetraethyl orthosilicate (TEOS) in an oxygen or oxygen-argon plasma.

Advantageously, but not necessarily, the materials forming the first stop layer 7 and the second stop layer 4 are identical.

The peripheral ring of materials that extends radially beyond the trench 3 bears the reference 14.

Figure 4:
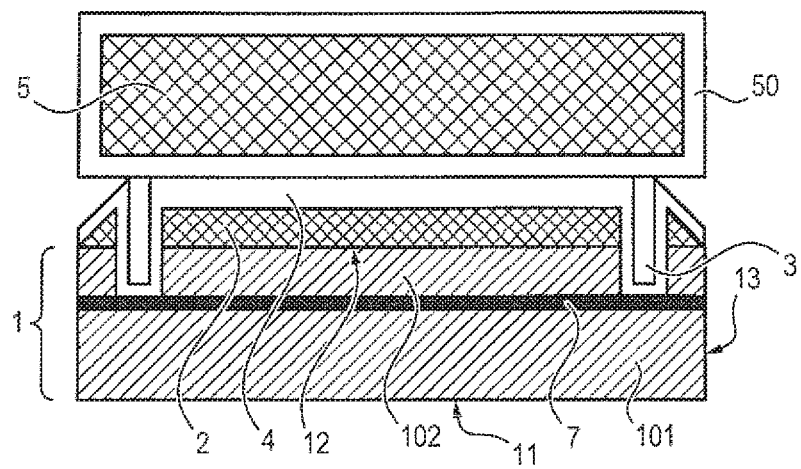

As represented in FIG. 4, a receiver substrate 5 is then bonded to the second stop layer 4 deposited on the donor substrate 1.

This bonding preferably takes place by molecular adhesion. It will be noted that the receiver substrate 5 may optionally be covered with a bonding layer 50, for example, a layer of silicon oxide ($SiO_2$) or a layer of silicon nitride ($Si_3N_4$).

Figure 5:
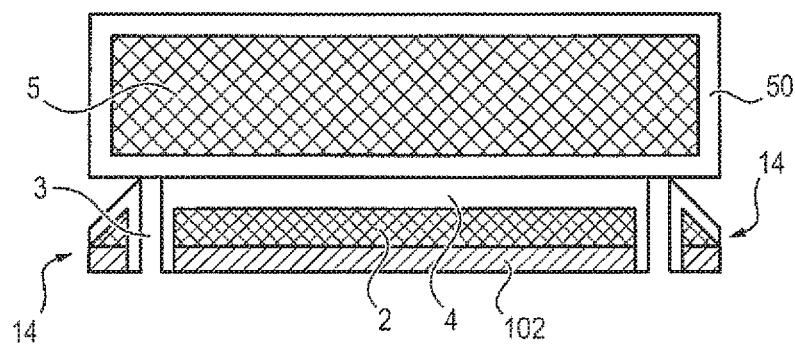

As can be seen in FIG. 5, the thinning of the donor substrate 1 is then carried out by chemical etching starting from its back side 11, so as to remove the back portion 101, and reach the etch stop layer 7.

This step also has the effect of removing the peripheral ring 14 of the donor substrate 1, not bonded to the receiver substrate 5, either directly, or after an additional mechanical thinning step, as will be described subsequently in greater detail.

The circuit layer 2 buried beneath the front portion 102, transferred to the receiver substrate 5, is thus obtained. The final substrate thus obtained bears the reference 6 (see FIG. 6).

The presence of the first stop layer 7 and of the second stop layer 4 on the exposed side 21 and the lateral edge of the circuit layer 2 guarantees that the circuits are not damaged during the chemical etching thinning phase and prevents infiltrations.

In the case where the stop zone is a silicon oxide stop layer 7 and where the material of the back portion 101 is silicon, the chemical etching thinning will advantageously be carried out using a bath of tetramethylammonium hydroxide (TMAH) or KOH (potassium hydroxide).

In the case where the stop zone is a stop interface 7', and where the back layer 101' is silicon and the front layer 102' is highly doped silicon, the chemical etching thinning may be carried out using a solution of sulfuric acid ($H_2SO_4$), a solution of phosphoric acid ($H_3PO_4$), hydrofluoric acid (HF) or propanoic acid ($C_2H_5COOH$).

The transfer process represented in FIGS. 7 to 9 will now be described. It is a variant of the process described previously with reference to FIGS. 1 to 6. The same components bear the same numerical references.

In this case, the donor substrate, referenced 1', is subjected to a peripheral routing. The routed portion bears the reference 3'.

This routing is carried out over the entire circumference of the donor substrate 1' and to a depth such that it passes entirely through the circuit layer 2 and extends into the donor substrate 1'.

This routing may be carried out by polishing or grinding, for example, using a tool applied to a portion of the lateral edge 13 of the donor substrate 1'.

The second stop layer 4 is, therefore, deposited both on the exposed side 21 of the circuit layer 2 and on the routed lateral side 13' of the donor substrate 1'.

After bonding to the receiver substrate 5 (see FIG. 8) and chemical thinning of the donor substrate 1' (see FIG. 9), the circuit layer 2 transferred to the receiver substrate 5 is obtained, either directly or after an additional step of mechanical polishing, as will be described subsequently.

Figure 6:
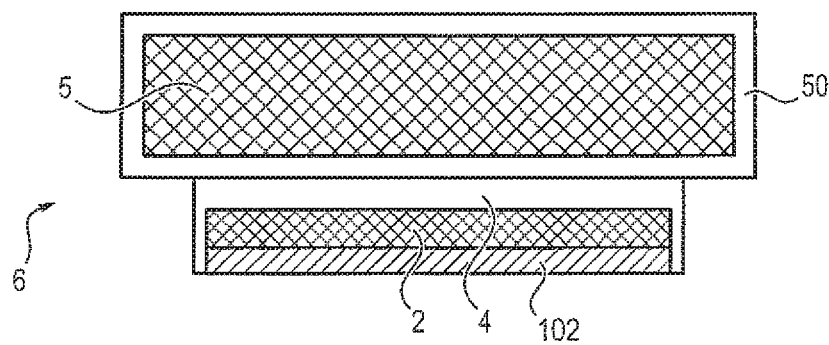

The final substrate referenced 6' is obtained, which differs from the substrate 6 from FIG. 6 in that the front portion 102 is replaced by the front layer 102'.

Figure 8:
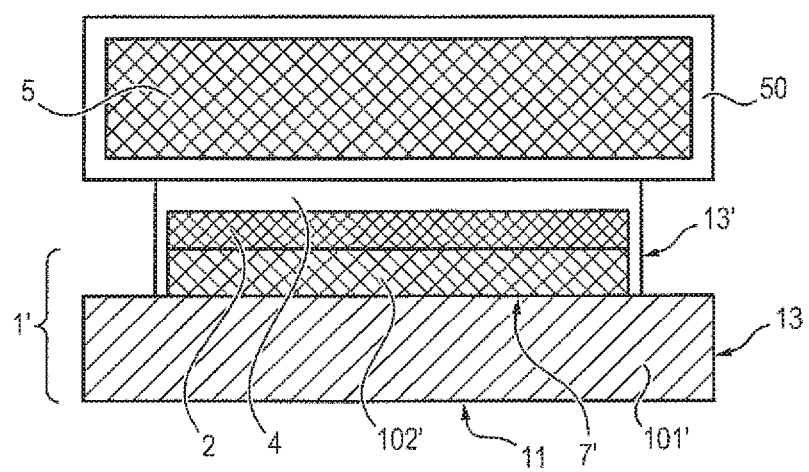
Figure 9:
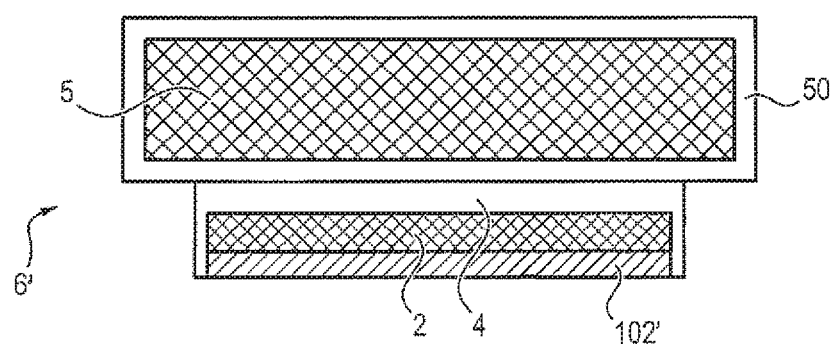

Although the option of peripheral annular routing has been described solely in connection with FIGS. 7 to 9, in which the donor substrate 1' is a substrate that comprises a stop interface 7', it should be understood that this routing step could also be carried out on the donor substrate 1 represented in FIGS. 1 to 6, which comprises the stop layer 7.

Conversely, the donor substrate 1' from FIGS. 7 to 9 could be subjected to the formation of the peripheral trench 3, as described in FIGS. 1 to 6.

In the various embodiments described above, the thicknesses of the first stop layer 7 and of the second stop layer 4 preferably lie between 0.01 µm and 100 µm.

The parameter regarding the depth of the peripheral trench 3 in the donor substrate 1' will now be described in connection with FIGS. 10A to 10D and 11A to 11D. Although not represented in these figures, the reasoning is the same whether the trench 3 is replaced by a peripheral routed portion 3' or whether the donor substrate is a substrate 1' having a stop interface 7'.

In FIG. 10A, the trench 3 is produced over a depth such that it passes entirely through the circuit layer 2 and extends into the donor substrate 1' but without reaching the stop layer 7.

In the variant represented in FIG. 10B, this trench 3 this time reaches the stop layer 7 but does not pass through it.

In both scenarios, after the step of chemical thinning of the back portion 101, and as can be seen respectively in FIGS. 11A and 11B, the peripheral ring 14 remains attached to the front portion 102 by a greater or lesser thickness of material. In both these cases, it will be necessary to carry out an additional step of mechanical removal of this residual ring 14, in particular, by a lateral chemical mechanical polishing or grinding.

In the embodiment variant represented in FIG. 10C, the peripheral trench 3 has a depth such that it passes through the etch stop layer 7, without, however, penetrating into the back portion 101 of material of the donor substrate 1.

In this case, the chemical etching is sufficient to remove the peripheral ring 14. Indeed, the residual thickness 40 of the second stop layer 4 is too small and, therefore, too fragile to retain the peripheral ring 14. This variant is, therefore, the preferential embodiment variant of the disclosure (see FIG. 11C).

Finally, according to a fourth embodiment variant of the disclosure, the peripheral trench 3 has a depth such that, not only does it pass through the etch stop layer 7, but it extends into the back portion 101 (see FIG. 10D).

In this case, and as represented in FIG. 11D, after the chemical etching step, it is observed that a "step" 41 of the material of the second stop layer 4 remains. This step will then be removed either due to its inherent fragility at its small thickness, or by grinding or chemical mechanical polishing, if it is desired to obtain a defect-free planarity.

Owing to the features of the disclosure, the circuit layer 2 is protected during its transfer and the layer 102' or the front portion 102 that covers it may be adjusted to the desired thickness by choosing the position of the stop layer 7.

The invention claimed is:
1. A process for transferring a buried circuit layer to a receiver substrate, the process comprising:

providing a donor substrate comprising an internal etch stop zone and covered on a front side of the donor substrate with a circuit layer;

producing over an entire circumference of the donor substrate, on the front side covered with the circuit layer, either a peripheral trench that extends at a distance from a lateral edge of the donor substrate, or a peripheral routing, the routing or the trench being produced over a depth such that the routing or the trench passes entirely through the circuit layer and extend into the donor substrate;

depositing on an exposed side of the circuit layer and on the routed side or on the walls of the trench, a second stop layer comprising a stop material that is selective with respect to etching of the circuit layer without filling the trench;

bonding the receiver substrate to the donor substrate on the side of the donor substrate covered by the second stop layer; and thinning the donor substrate by chemical etching of a back side of the donor substrate, until the etch stop zone is reached, so as to obtain transfer of the buried circuit layer to the receiver substrate.

2. The process of claim 1, wherein the etch stop zone comprises a first stop layer including a material that is selective with respect to etching of the material of the of the donor substrate.

3. The process of claim 2, wherein the peripheral routing or the peripheral trench has a depth such that it passes through the etch stop zone without penetrating into a back portion or a back layer of the donor substrate.

4. The process of claim 1, wherein the donor substrate includes a doped front layer and a non-doped back layer, and wherein the etch stop zone comprises an interface between the doped front layer and the non-doped back layer of the donor substrate.

5. The process of claim 4, wherein the peripheral routing or the peripheral trench has a depth such that it passes through the etch stop zone without penetrating into a back portion or a back layer of the donor substrate.

6. The process of claim 1, wherein the peripheral routing or the peripheral trench has a depth such that it passes through the etch stop zone without penetrating into a back portion or a back layer of the donor substrate.

7. The process of claim 1, wherein the peripheral routing or the peripheral trench is produced over a depth such that it does not pass through the etch stop zone and wherein, after the chemical etching of the back side of the donor substrate, an additional step of mechanical removal of a residual peripheral ring of the donor substrate is carried out.

8. The process of claim 7, wherein the mechanical removal of the residual peripheral ring of the donor substrate is carried out by grinding or chemical mechanical polishing (CMP).

9. The process of claim 1, wherein the peripheral routing or the peripheral trench has a depth such that it passes through the etch stop zone and extends into a back portion or a back layer of the donor substrate and wherein, after the chemical etching of the back side of the donor substrate, an additional step of mechanical removal of a residue of the second stop layer is carried out.

10. The process of claim 9, wherein the mechanical removal of the residue of the second stop layer is carried out by grinding or chemical mechanical polishing (CMP).

11. The process of claim 1, wherein the second stop layer is deposited by chemical vapor deposition (CVD) or spin coating.

12. The process of claim 1, wherein the peripheral trench is produced with the aid of at least one of laser etching, dry etching and wet etching.

13. The process of claim 1, wherein the peripheral trench is located at a distance from the lateral edge of the donor substrate of less than or equal to 5 mm.

14. The process of claim 1, wherein a width of the trench is between 10 μm and 500 μm.

15. The process of claim 1, wherein the materials of the first stop layer and the second stop layer are oxides or nitrides.

16. The process of claim 15, wherein the materials of the first stop layer and the second stop layer are individually selected from the group consisting of silicon oxide ($SiO_2$), silicon oxynitride ($SiO_xN_y$) and silicon oxycarbide ($SiO_xC_y$).

17. The process of claim 1, wherein the materials of the first stop layer and the second stop layer are identical.

18. The process of claim 1, wherein the donor substrate comprises a semiconductor material.

19. The process of claim 1, wherein the bonding of the donor substrate and the receiver substrate takes place by molecular adhesion.

* * * * *